United States Patent
Mei et al.

(10) Patent No.: US 11,616,436 B2
(45) Date of Patent: Mar. 28, 2023

(54) ERROR AMPLIFIER WITH PROGRAMMABLE ON-CHIP AND OFF-CHIP COMPENSATION

(71) Applicant: TEXAS INSTRUMENTS INCORPORATED, Dallas, TX (US)

(72) Inventors: Tawen Mei, Sunnyvale, CA (US); Karen Chan, South San Francisco, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 233 days.

(21) Appl. No.: 16/782,525

(22) Filed: Feb. 5, 2020

(65) Prior Publication Data
US 2021/0242773 A1  Aug. 5, 2021

(51) Int. Cl.
*H02M 3/156* (2006.01)
*H03K 5/24* (2006.01)

(52) U.S. Cl.
CPC .............. *H02M 3/156* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 6,710,583 B2* | 3/2004 | Stanescu | G05F 1/575 323/280 |
| 8,705,308 B2* | 4/2014 | Pu | G11C 11/40626 365/205 |
| 8,866,450 B2* | 10/2014 | Kirchner | H02M 3/07 323/222 |
| 9,130,466 B2* | 9/2015 | Huang | H02M 3/33507 |
| 9,471,077 B2* | 10/2016 | Kobayashi | G05F 1/575 |
| 11,005,356 B2* | 5/2021 | Kikuchi | H02M 1/083 |

* cited by examiner

*Primary Examiner* — Jeffrey A Gblende
(74) *Attorney, Agent, or Firm* — Ray A. King; Frank D. Cimino

(57) ABSTRACT

A system includes: an input voltage source; a power stage coupled to the input voltage source; a load coupled to an output of the power stage; and an error amplifier circuit coupled to the power stage. The error amplifier circuit includes an error amplifier; a transconductance stage coupled to an output of the error amplifier; an internal compensation switch; an external compensation switch; and control logic coupled to the internal compensation switch and the external compensation switch. The control logic is configured to selectively operate the internal compensation switch and the external compensation switch in one of an internal compensation mode and an external compensation mode.

18 Claims, 4 Drawing Sheets

ERROR AMPLIFIER WITH PROGRAMMABLE ON-CHIP AND OFF-CHIP COMPENSATION

BACKGROUND

The proliferation of consumer electronic devices and integrated circuit (IC) technology has resulted in the commercialization of IC products. As new consumer electronic devices are developed and IC technology advances, new IC products are commercialized. One example IC product that is needed in consumer electronic devices is a switching converter. In one example switching converter, a control circuit with an error amplifier and stability compensation is used.

In some switching converter topologies with an error amplifier, internal compensation is provided for ease of use at the expense of compromised performance. For demanding applications, external compensation is a better option to facilitate customization to a given application. However, external compensation involves contradictory requirements in the design of the error amplifier relative to internal compensation. Specifically, an internal compensation network is usually high impedance to reduce chip area, while an external compensation network is low impedance for noise immunity.

SUMMARY

In accordance with at least one example of the disclosure, a system comprises an input voltage source; a power stage coupled to the input voltage source; a load coupled to an output of the power stage; and an error amplifier circuit coupled to the power stage. The error amplifier circuit comprises an error amplifier; a transconductance stage coupled to an output of the error amplifier; an internal compensation switch; an external compensation switch; and control logic coupled to the internal compensation switch and the external compensation switch. The control logic is configured to selectively operate the internal compensation switch and the external compensation switch in one of an internal compensation mode and an external compensation mode.

In accordance with at least one example of the disclosure, a switching converter circuit comprises a pulse-width modulation (PWM) comparator and an error amplifier circuit coupled to an input of the PWM comparator. The error amplifier circuit comprises an error amplifier with a reference voltage input and with a feedback voltage input. The error amplifier circuit also comprises an internal compensation circuit coupled to an output of the error amplifier, wherein the internal compensation circuit includes an internal compensation switch. The error amplifier circuit also comprises a transconductance stage coupled to an output of the error amplifier. The error amplifier circuit also comprises an external compensation switch coupled between an output of the transconductance stage and the internal compensation switch. The error amplifier circuit also comprises an external compensation pad coupled to the external compensation switch and the output of the transconductance stage.

In accordance with at least one example of the disclosure, an error amplifier circuit comprises an error amplifier and a transconductance stage coupled to an output of the error amplifier. The error amplifier circuit also comprises an internal compensation circuit coupled to an output of the error amplifier, wherein the internal compensation circuit comprises an internal compensation switch. The error amplifier circuit also comprises an external compensation switch coupled to the internal compensation switch. The error amplifier circuit is configured to selectively use one of internal compensation based on the internal compensation circuit and external compensation.

BRIEF DESCRIPTION OF THE DRAWINGS

For a detailed description of various examples, reference will now be made to the accompanying drawings in which.

DETAILED DESCRIPTION

Figure 1:
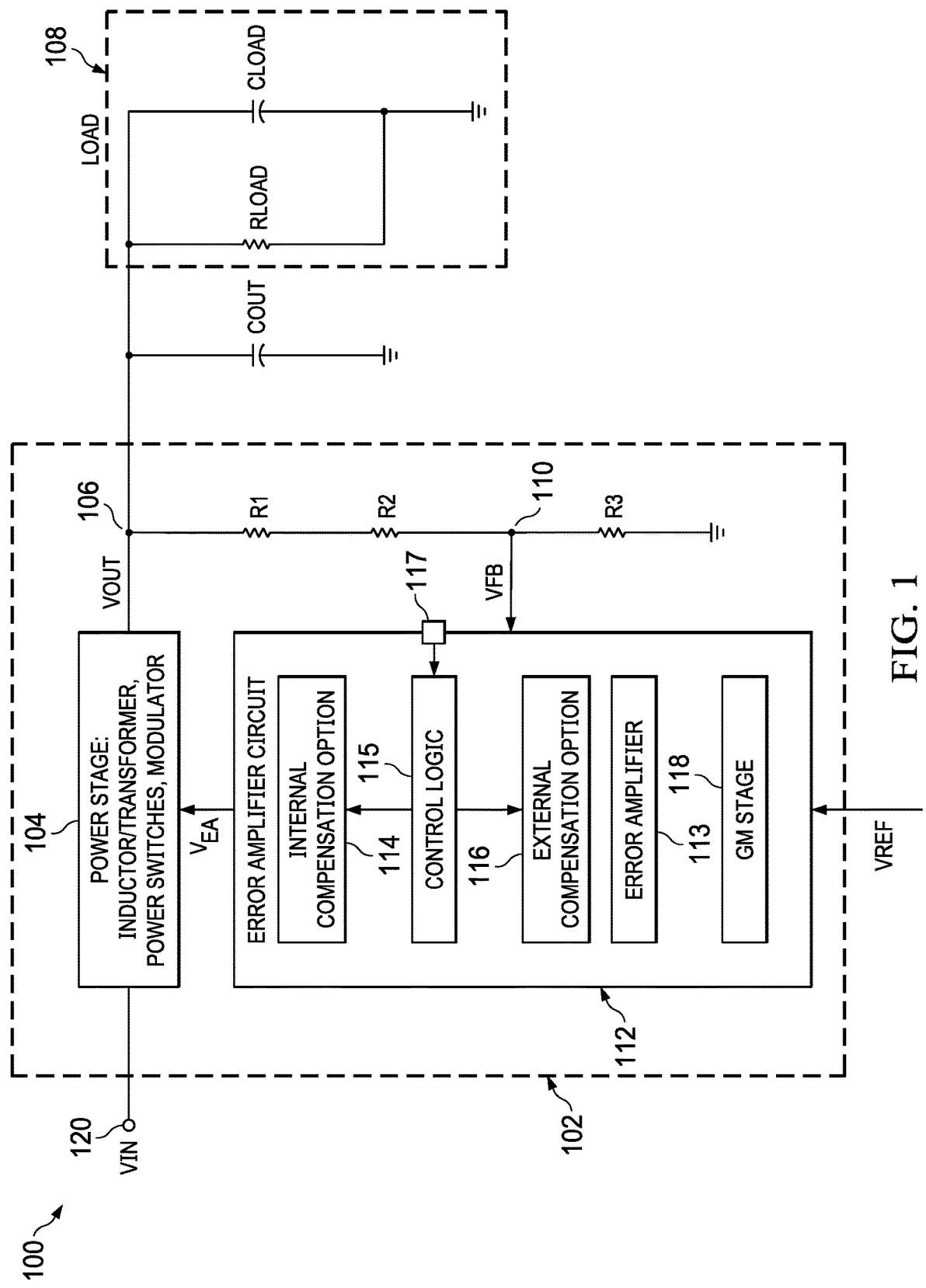
FIG. 1 is a block diagram showing an electrical system having an error amplifier circuit with on-chip and off-chip compensation options in accordance with some examples.

Disclosed herein are error amplifier circuit topologies with on-chip and off-chip compensation options. In some examples, the error amplifier circuit is part of the control loop for a switching converter. In such examples, the error amplifier circuit includes components to enable an internal compensation (on-chip) option as well as an external compensation (off-chip) option.

An example system or switching converter includes an input voltage source and a power stage coupled to the input voltage source. The system or switching converter also includes a load coupled to an output of the power stage. In some examples, the power stage includes a pulse-width modulation (PWM) comparator, where the output of the PWM comparator is coupled to a driver circuit configured to drive switches (e.g., a high-side switch and a low-side switch) of the power stage. To regulate the output voltage of the switching converter to the load over time, the system or switching converter includes an error amplifier circuit coupled to one of the inputs of the PWM comparator.

In some examples, the error amplifier circuit includes an error amplifier with a reference voltage (VREF) input and with a feedback voltage (VFB) input. The error amplifier circuit also includes an internal compensation circuit coupled to an output of the error amplifier, where the internal compensation circuit includes an internal compensation switch. The error amplifier circuit also includes a transconductance stage coupled to an output of the error amplifier. The error amplifier circuit also includes an external compensation switch coupled between an output of the transconductance stage and the internal compensation switch. The error amplifier circuit also includes an external compensation pad coupled to the external compensation switch and the output of the transconductance stage.

In some examples, the internal compensation circuit includes a resistor with a first end coupled to the output of the error amplifier and with a second end coupled to a first terminal of the internal compensation switch. The internal compensation circuit also includes a capacitor with a first plate coupled to a second terminal of the internal compensation switch and with a second plate coupled to a ground node. More specifically, in some examples, the error amplifier circuit includes a first feedback loop between an output of the transconductance stage and a negative input of the transconductance stage. The error amplifier circuit also includes a second feedback loop between an output of the transconductance stage and a positive input of the transconductance stage. In such examples, the resistor of the internal compensation circuit is part of the second feedback loop and is not part of the first feedback loop. Also, the external compensation switch and the capacitor of the internal compensation circuit are coupled between an internal node of the second feedback loop and a ground node, where the internal node is not part of the first feedback loop.

In some examples, the error amplifier circuit also includes control logic configured to control the internal compensation switch and the external compensation switch. In one example, when an external compensation circuit is coupled to the external compensation pad (or when the control logic receives a related signal indicating an external compensation circuit is in use), the control logic is configured to turn the external compensation switch on and to turn the internal compensation switch off. Otherwise, when an external compensation circuit is not coupled to the external compensation pad, the control logic is configured to turn the external compensation switch off and to turn the internal compensation switch on.

With the proposed error amplifier circuit topology, an error amplifier with an internal compensation circuit is provided, where a low-clamp and a high-clamp for the error amplifier output remain in place regardless whether the error amplifier is driving an internal compensation circuit or an external compensation circuit. In some examples, a transconductance stage is cascaded after the error amplifier in an arrangement such that the error amplifier can see the external compensation but with impedance multiplied to a suitable level. In the proposed error amplifier circuit topology, the transconductance stage performs the impedance transformation on the external compensation circuit so that the same low-clamp and high-clamp for the error amplifier output are kept at the same node, and few changes are made to the rest of the error amplifier circuit. This helps keep the impedance high, which reduces power consumption. Also, noise and high-current consumption of the transconductance stage are confined to driving the external compensation network.

In an alternative error amplifier circuit, two error amplifiers are used and are switched between depending on which one is called upon. However, with this alternative arrangement, trimming of two offsets is needed, as well as peripheral circuits (e.g., error amplifier output low-clamp and high-clamp components) to limit the amplifier output voltage to a minimum and maximum value that can be utilized by the down-stream circuits. To provide a better understanding, various error amplifier circuit options and related systems or scenarios are described using the figures as follows.

FIG. 1 is a block diagram showing an electrical system 100 having an error amplifier circuit 112 with on-chip and off-chip compensation options in accordance with some examples. As shown, the electrical system 100 includes a switching converter 102 having a power stage 104 coupled to an error amplifier circuit 112. In different examples, the topology of the power stage 104 varies. Example components for the power stage include an inductor, a transformer, power switches, and a modulator. Example topologies for the power stage 104 include a buck converter topology, a boost converter topology, or a buck-boost converter topology. In operation, the power stage 104 is configured to provide an output voltage (VOUT) to an output node 106 based on an input voltage (VIN) at a VIN node 120 and based on an output (VEA) of the error amplifier circuit 112. The electrical system 100 also includes an output capacitor (COUT) and a load 108 coupled to the output node 106, where COUT and the load 108 are in parallel between the output node 106 and a ground node. In the example of FIG. 1, the load 108 is represented as a resistor (RLOAD) and a capacitor (CLOAD).

As shown, the error amplifier circuit 112 is represented as having an error amplifier 113, an internal compensation option 114, an external compensation option 116, and a transconductance (Gm) stage 118. In some examples, the error amplifier 113 and the transconductance stage 118 are cascaded stages, where components of the internal compensation option 114 and the external compensation option 116 are selectively used for compensation of the cascaded stages. In some examples, the error amplifier 113 is configured to receive VREF and VFB as inputs, where VFB is proportional to VOUT and is provided by a voltage divider (e.g., R1, R2, R3) coupled to the output node 106.

In some examples, the internal compensation option 114 includes an internal compensation switch (see e.g., $S_{INT}$ in FIG. 4) to selectively enable an internal compensation circuit. In one example, the internal compensation circuit includes a resistor (see e.g., $R_{INT}$ in FIG. 4) with a first end coupled to the output of the error amplifier 113 and with a second end coupled to a first terminal of the internal compensation switch. The internal compensation circuit also includes a capacitor (see e.g., $C_{INT}$ in FIG. 4) with a first plate coupled to a second terminal of the internal compensation switch and with a second plate coupled to a ground node. In some examples, the error amplifier circuit 112 includes a first feedback loop (see e.g., the first feedback loop 408 in FIG. 4) between an output of the transconductance stage and a negative input of the transconductance stage. The error amplifier circuit also includes a second feedback loop (see e.g., the second feedback loop 410 in FIG. 4) between an output of the transconductance stage and a positive input of the transconductance stage. In such examples, the resistor (e.g., $R_{INT}$ in FIG. 4) of the internal compensation circuit is part of the second feedback loop and is not part of the first feedback loop.

Figure 4:
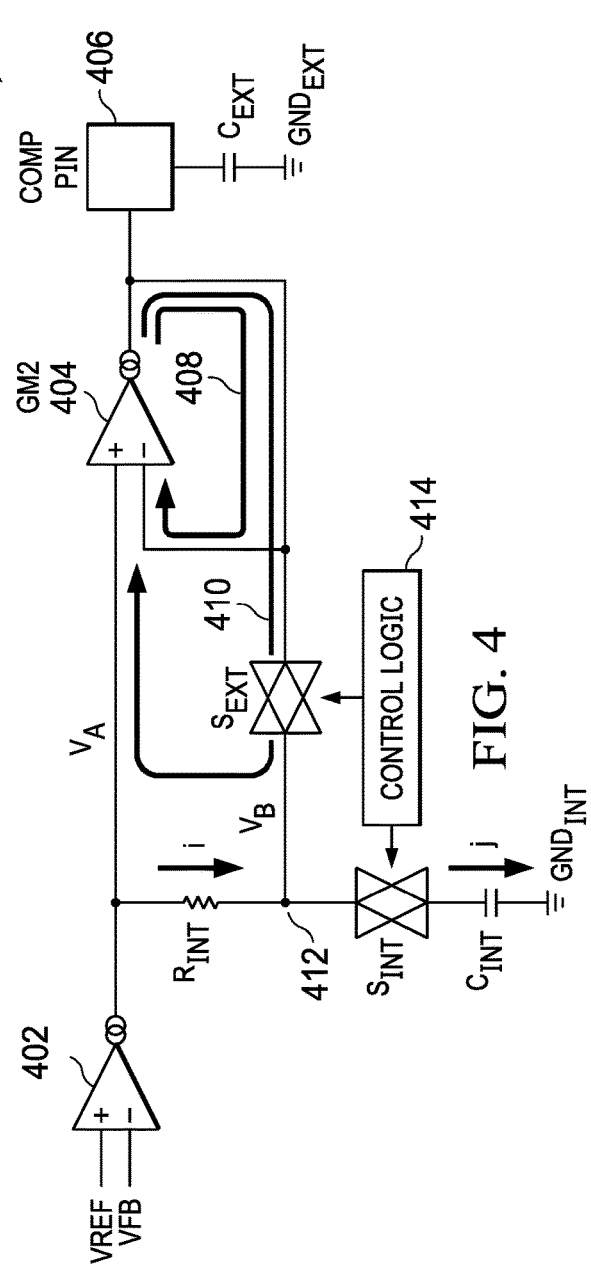
FIG. 4 is a diagram showing another error amplifier circuit with on-chip and off-chip compensation options in accordance with some examples.

In some examples, the external compensation option 116 includes an external compensation switch (see e.g., $S_{EXT}$ in FIG. 4) and an external compensation pad (see e.g., the external compensation pad 406 in FIG. 4) coupled to an external ground (e.g., $GND_{EXT}$ in FIG. 4). In one example, the external compensation switch and the capacitor of the internal compensation circuit are coupled between an internal node (see e.g., node 412 in FIG. 4) of the second feedback loop and a ground node, where the internal node is not part of the first feedback loop.

In some examples, the control logic 115 is configured to control an internal compensation switch of the internal compensation option 114 and an external compensation switch of the external compensation option 116. In one example, when an external compensation circuit is coupled to an external compensation pad of the external compensation option 116, the control logic 115 is configured to turn the external compensation switch on and to turn the internal compensation switch off. Otherwise, when an external compensation circuit is not coupled to the external compensation pad of the external compensation option 116, the control logic 115 is configured to turn the external compensation switch off and to turn the internal compensation switch on.

In some examples, a control signal is received via a control pad 117 to indicate use of an external compensation circuit for the error amplifier circuit 112.

With the error amplifier circuit 112, an internal compensation circuit is provided for the error amplifier 113, where a low-clamp and a high-clamp for an output of the error amplifier 113 remain in place regardless whether the error amplifier 113 is driving an internal compensation circuit or an external compensation circuit. In some examples, the transconductance stage 118 is cascaded after the error amplifier 113 in an arrangement such that the error amplifier 113 can see the external compensation but with impedance multiplied to a suitable level. In some examples of the error amplifier circuit 112, the transconductance stage 118 performs the impedance transformation on the external compensation circuit so that the same low-clamp and high-clamp for the output of the error amplifier 113 are kept at the same node, and few changes are made to the rest of the error amplifier circuit 112. This helps keep the impedance high, which reduces power consumption. Also, noise and high-current consumption of the transconductance stage 118 are confined to driving the external compensation network.

Figure 2:
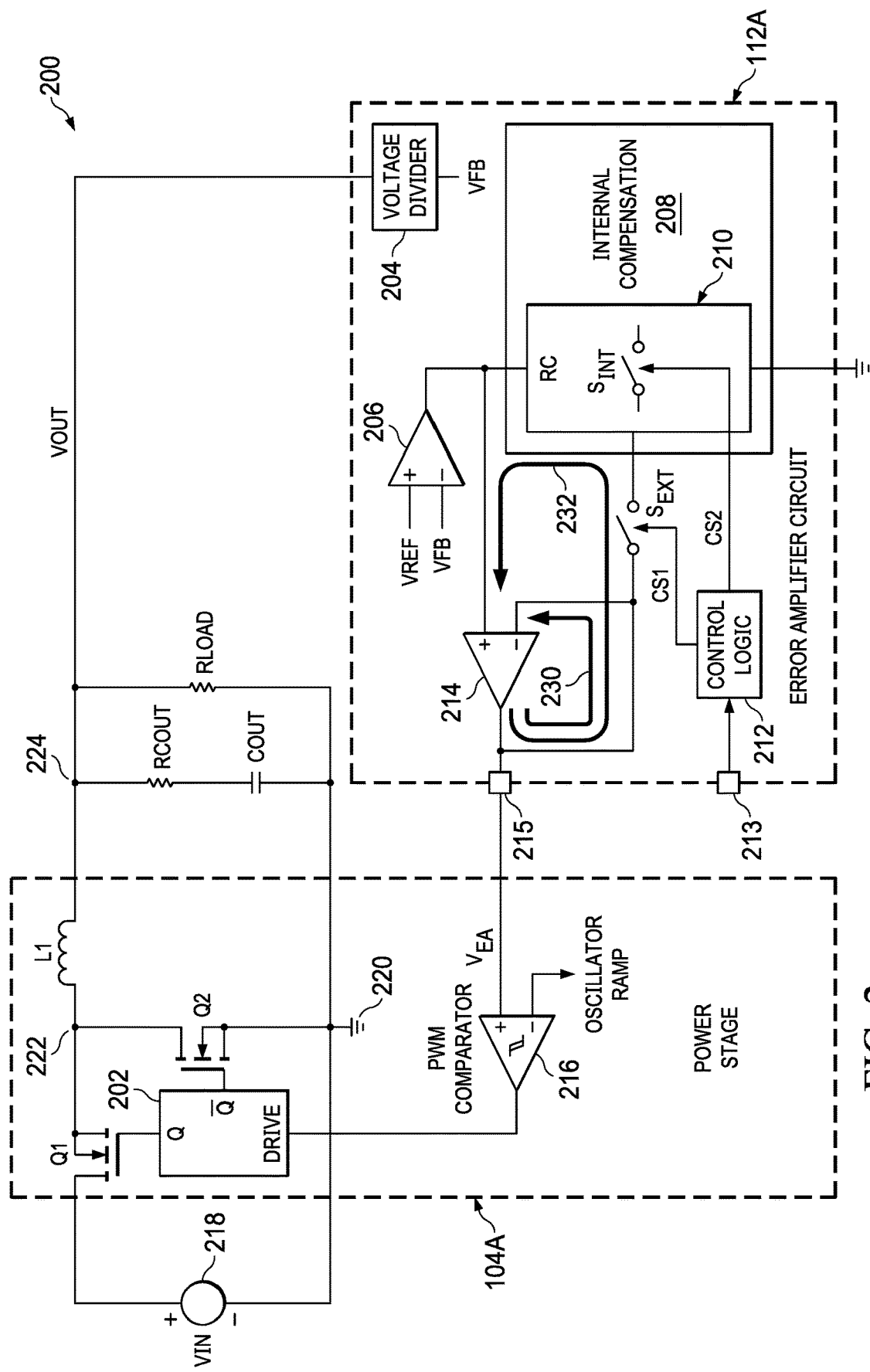
FIG. 2 is a diagram showing example components of an electrical system having an error amplifier circuit with on-chip and off-chip compensation options in accordance with some examples.

FIG. 2 is a diagram showing example components of an electrical system 200 having an error amplifier circuit 112A (an example of the error amplifier circuit 112 in FIG. 1) with on-chip and off-chip compensation options in accordance with some examples. In the example of FIG. 2, the electrical system 200 includes a power stage 104A of a switching converter (an example of the power stage 104 in FIG. 1) coupled the error amplifier circuit 112A. As shown, the power stage 104A includes a PWM comparator 216 with a first input configured to receive VEA from the error amplifier circuit 112A, and with a second input configured to receive an oscillator ramp. The output of the PWM comparator 216 is provided to a drive circuit 202 configured to provide drive signals to power switches (Q1 and Q2) of the power stage 104A based on the output of the PWM comparator 216. In the example of FIGS. 1, Q1 and Q2 are part of a buck converter topology, where Q1 is a high-side switch coupled to a VIN source 218, and where Q2 is a low-side switch coupled to ground node 220. The power stage 104A also includes an inductor (L1) with a first end coupled to a switch node 222 between Q1 and Q2. The second end of L1 is coupled to an output node 224, where the output voltage (VOUT) at the output node 224 is provided to an output capacitor (COUT) with resistance (RCOUT) and to a load (RLOAD).

As shown, VOUT is also provided to a voltage divider 204 included with or coupled to the error amplifier circuit 112A, where the output of the voltage divider is a feedback voltage (VFB) proportional to VOUT. In the example of FIG. 2, the error amplifier circuit 112A includes an error amplifier 206 (an example of the error amplifier 113) configured to received VREF and VFB as inputs. The output of the error amplifier 206 is coupled to an internal compensation circuit 208 that includes an RC network 210 with an internal compensation switch ($S_{INT}$). In some examples, the RC network 210 includes a resistor (see e.g., $R_{INT}$ in FIG. 4), $S_{INT}$, and a capacitor (see e.g., $C_{INT}$ in FIG. 4), where the resistor is part of a feedback loop (see e.g., the feedback loop 410 in FIG. 4), and where $S_{INT}$ and the capacitor are coupled to an internal node (see e.g., node 412 in FIG. 4) of the feedback loop.

In the example of FIG. 2, the error amplifier circuit 112A also includes a transconductance stage 214 (an example of the transconductance stage 118 in FIG. 1) coupled to an output of the error amplifier 206 to form a cascaded arrangement. The output of the transconductance stage 214 is coupled to an external compensation pad 215 as well as the PWM comparator 216. In the example of FIG. 2, a first feedback loop 230 is formed between the output and the negative input of the transconductance stage 214. Also, a second feedback loop 232 is formed between the output and the positive input of the transconductance stage 214. As shown, an external compensation switch ($S_{EXT}$) of the error amplifier circuit 112A is part of the second feedback loop 232 and not the first feedback loop 230.

In the example of FIG. 2, the error amplifier circuit 112A also includes control logic 212 (an example of the control logic 115 in FIG. 1) coupled to and configured to control $S_{INT}$ and $S_{EXT}$. In one example, when an external compensation circuit is coupled to the external compensation pad 215, the control logic 212 is configured to turn $S_{EXT}$ on and to turn $S_{INT}$ off. Otherwise, when an external compensation circuit is not coupled to the external compensation pad 215, the control logic 212 is configured to turn the external compensation switch off and to turn the internal compensation switch on. In some examples, a control signal is received via a control pad 213 included with or coupled to the error amplifier circuit 112A to indicate use of an external compensation circuit with the error amplifier circuit 112A.

Figure 3:
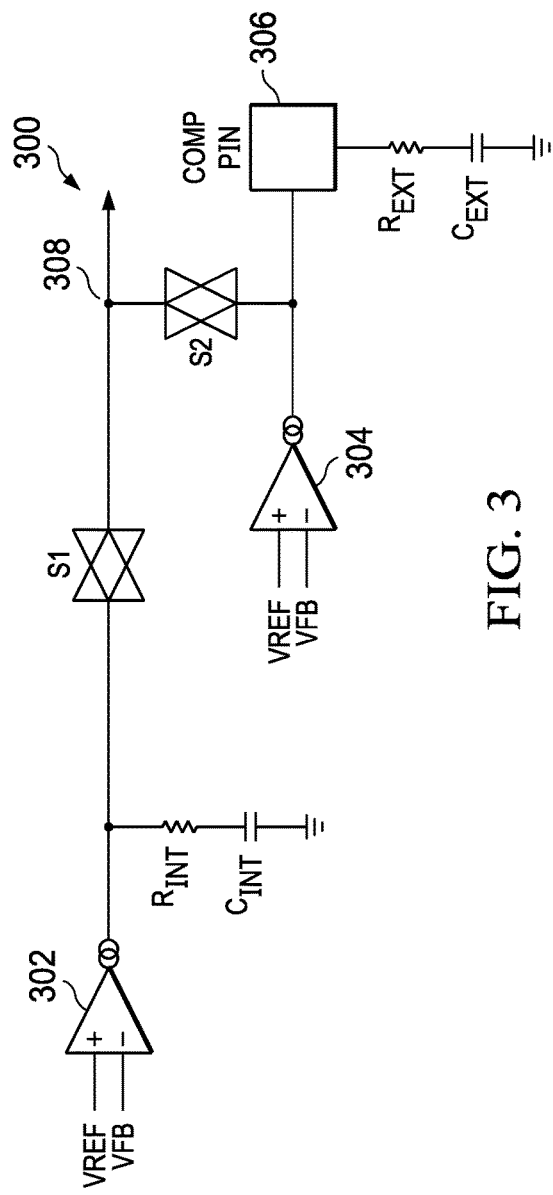
FIG. 3 is a diagram showing an error amplifier circuit with on-chip and off-chip compensation options in accordance with some examples.

FIG. 3 is a diagram showing an error amplifier circuit 300 in accordance with some examples. In FIG. 3, the error amplifier circuit 300 includes two error amplifiers 302 and 304, where both are configured to receive VREF and VFB. As shown, the output of the first error amplifier 302 is coupled to an output node 308 of the error amplifier circuit 300 via a first switch (S1). Also, an internal compensation network with $R_{INT}$ and $C_{INT}$ is coupled to an output of the first error amplifier 302. As shown, the output of the second error amplifier 304 is coupled to the output node 308 of the error amplifier circuit 300 via a second switch (S2). Also, an external compensation network with $R_{EXT}$ and $C_{EXT}$ is coupled to an output of the second error amplifier 302. When S1 is closed and S2 is open, the first error amplifier 302 and the internal compensation network provide an output to the output node 308. To enable external compensation instead of internal compensation, S2 is closed and S1 is opened such that the second error amplifier 302 and the external compensation network provides an output to the output node 308.

The error amplifier circuit 300 represents a functional but overly complex solution, where the outputs of the first and second error amplifiers 302 and 304 are multiplexed using S1 and S2. One example of the complexity of the error amplifier circuit 300 is that both the first and second error amplifiers 302 and 304 need to be trimmed for offset, which is time consuming and costly.

FIG. 4 is a diagram showing another error amplifier circuit 400 in accordance with some examples. As shown, the error amplifier circuit 400 includes an error amplifier 402 with VREF and VFB as inputs. The error amplifier circuit 400 also includes an internal compensation circuit coupled to an output of the error amplifier 402, where the internal compensation circuit in FIG. 4 includes $R_{INT}$, $S_{INT}$, and $C_{INT}$. The error amplifier circuit 400 also includes a transconductance stage 404 coupled to an output of the error amplifier 402. The error amplifier circuit 400 also includes an external compensation switch ($S_{EXT}$) coupled between an output of the transconductance stage 404 and $S_{INT}$. The error amplifier circuit 400 also includes an external compensation pad 406 coupled to $S_{EXT}$ and the output of the transconductance stage 404.

As shown, the first end of $R_{INT}$ is coupled to the output of the error amplifier 402 and the second end of $R_{INT}$ is coupled to a first terminal of $S_{INT}$. Also, a first plate of $C_{INT}$ is coupled to a second terminal of $S_{INT}$ and a second plate $C_{INT}$ is coupled to a ground node. Also, in the example of FIG. 4, the error amplifier circuit 400 includes a first feedback loop 408 between an output of the transconductance stage 404 and a negative input of the transconductance stage 404. The error amplifier circuit 400 also includes a second feedback loop 410 between an output of the transconductance stage 404 and a positive input of the transconductance stage 404. In such examples, $R_{INT}$ is part of the second feedback loop 410 and is not part of the first feedback loop 408. Also, $S_{EXT}$ and $C_{INT}$ are coupled between an internal node 412 of the second feedback loop 410 and an internal ground node ($GND_{INT}$), where the internal node 412 is not part of the first feedback loop 408.

In some examples, the error amplifier circuit 400 also includes control logic 414 configured to control $S_{INT}$ and $S_{EXT}$. In one example, when an external compensation circuit (e.g., $C_{EXT}$) is coupled to the external compensation pad (or when the control logic receives a related signal indicating an external compensation circuit is in use), the control logic 414 is configured to turn $S_{EXT}$ on and to turn $S_{INT}$ off. Otherwise, when an external compensation circuit is not coupled to the external compensation pad 406, the control logic 414 is configured to turn $S_{EXT}$ off and to turn $S_{INT}$ on.

With the error amplifier circuit 400, the transconductance stage 404 is cascaded after the error amplifier 402, where the transconductance stage 404 has higher transconductance than the error amplifier 402 so there is lower output impedance. Also, the internal compensation circuit (e.g., $R_{INT}$ and $C_{INT}$) is coupled to the output of the error amplifier 402, while the external compensation circuit (if used) is coupled to the output of the transconductance stage 404. With the arrangement of the error amplifier circuit 400, only the error amplifier 402 needs to be trimmed and clamped. Compared to a second error amplifier (as in FIG. 3), use of the transconductance stage 404 is simple, low cost, and low power.

In the example of FIG. 4, the voltage at the output of the error amplifier 402 is labeled $V_A$. When external compensation is not used, the $S_{INT}$ is on $S_{EXT}$ is off such that the error amplifier 402 and the internal compensation network ($R_{INT}$ and $C_{INT}$) is unaffected. When external compensation is used, $S_{INT}$ is off and $S_{EXT}$ in on, causing the voltage ($V_B$) at the internal node 412 to be connected to the external compensation network (e.g., $C_{EXT}$ in FIG. 4). However, the external compensation network is bootstrapped by the transconductance stage 404 so the impedance seen at the output of the error amplifier 402 is much higher (gm×R higher, where gm is the gain of the transconductance stage and R corresponds to $R_{INT}$).

In the example of FIG. 4, the impedance at the output the error amplifier 402 is derived as follows. Assuming the external compensation network at the external compensation pad 460 has the impedance of Z, then $$i=(V_A-V_B)/R, \quad \text{Equation (1)}$$

$$V_B = j \cdot Z, \text{ and} \quad \text{Equation (2)}$$

$$j=(V_A-V_B) \cdot gm+i. \quad \text{Equation (3)}$$

After substituting equations (1) and (2) into equation (3) and re-arranging, the following is derived: $j=(V_A-V_B) \cdot gm_2 + (V_A-V_B)/R = V_A \cdot (gm+1/R) + V_B \cdot (gm+1/R) = V_B/Z$. Also, $V_A \cdot [gm+1/R] = V_B \cdot [gm+1/R+1/Z]$. Also, $V_B = V_A \cdot (gm+1/R)/(gm_2+1/R+1/Z)$. The impedance at the output of the error amplifier 402 is just $V_A/i$, which is $V_A/[(V_A-V_B)/R]$. Accordingly, $V_A - V_B = V_A - [V_A \cdot (gm+1/R)/(gm+1/R+1/Z)] = V_A \cdot (1/Z)/(gm+1/R+1/Z)$. Also, $i=(V_A-V_B)/R = V_A \cdot R \cdot (1/Z)/(gm+1/R+1/Z)$. Finally, $V_A/i = V_A/[V_A/R \cdot (1/Z)/(gm+1/R+1/Z)] = R \cdot Z[gm+1/R+1/Z] = Z \cdot (gm \cdot R+1)+R$, where R corresponds to $R_{INT}$. Accordingly, with the external compensation network, the impedance at the output of the error amplifier 402 is $Z \cdot (gm \cdot R+1)+R$. In contrast, if the internal compensation network is used, the impedance at the output of the error amplifier 402 is $1/[s \cdot C_{INT}]+R$. For the two compensations to be equivalent, Z needs to be $C_{INT} \times [gm \cdot R+1]$. In some examples, the quantity $gm \cdot R+1$ is designed to be much greater than 1, so that $C_{EXT}$ can be large and hence more immune from noise. As desired, a user can add various components to the external compensation network and the relationship of $gm \cdot R+1$ is preserved.

With the proposed arrangement of the error amplifier circuit 400, there is only one output rather than two outputs multiplexed. Also, there is only one low-clamp and high-clamp (see e.g., block 510 in FIG. 5) for the output of the error amplifier. Compared to the error amplifier circuit 300 of FIG. 3, the error amplifier circuit 400 of FIG. 4 eliminates the need to implement voltage clamping circuits capable of clamping the external compensation pad 406. Such clamping is not trivial as the current can be a few milli-Amperes. Also, the quiescent current for the error amplifier circuit 400 of FIG. 4 is lower than the error amplifier circuit 300 of FIG. 3 due to clamping internal nodes where impedances are high. Also, the error amplifier circuit 400 of FIG. 4 is less noisy than the error amplifier circuit 300 of FIG. 3 since internal nodes (e.g., the internal node 412 and $V_A$) are referenced to an internal ground ($GND_{INT}$). In some examples, $GND_{INT}$ and $GND_{EXT}$ are not necessarily at the same potential. Also, it should be appreciated that $GND_{INT}$ is shared by other circuitry of an integrated circuit (IC) with the error amplifier circuit 400 (excluding $C_{EXT}$).

Compared to the error amplifier circuit 300 of FIG. 3, the error amplifier circuit 400 of FIG. 4 is simpler to implement. In part, this is because the clamps now clamp internal nodes, which means they are less likely to pick up noise originated at the printed circuit board (PCB). Also, the clamps (see e.g., block 510 in FIG. 5) do not need to be able to source/sink mA, which reduces introducing noise to internal supplies. Also, only the error amplifier 402 needs to be trimmed for offset.

Figure 5:
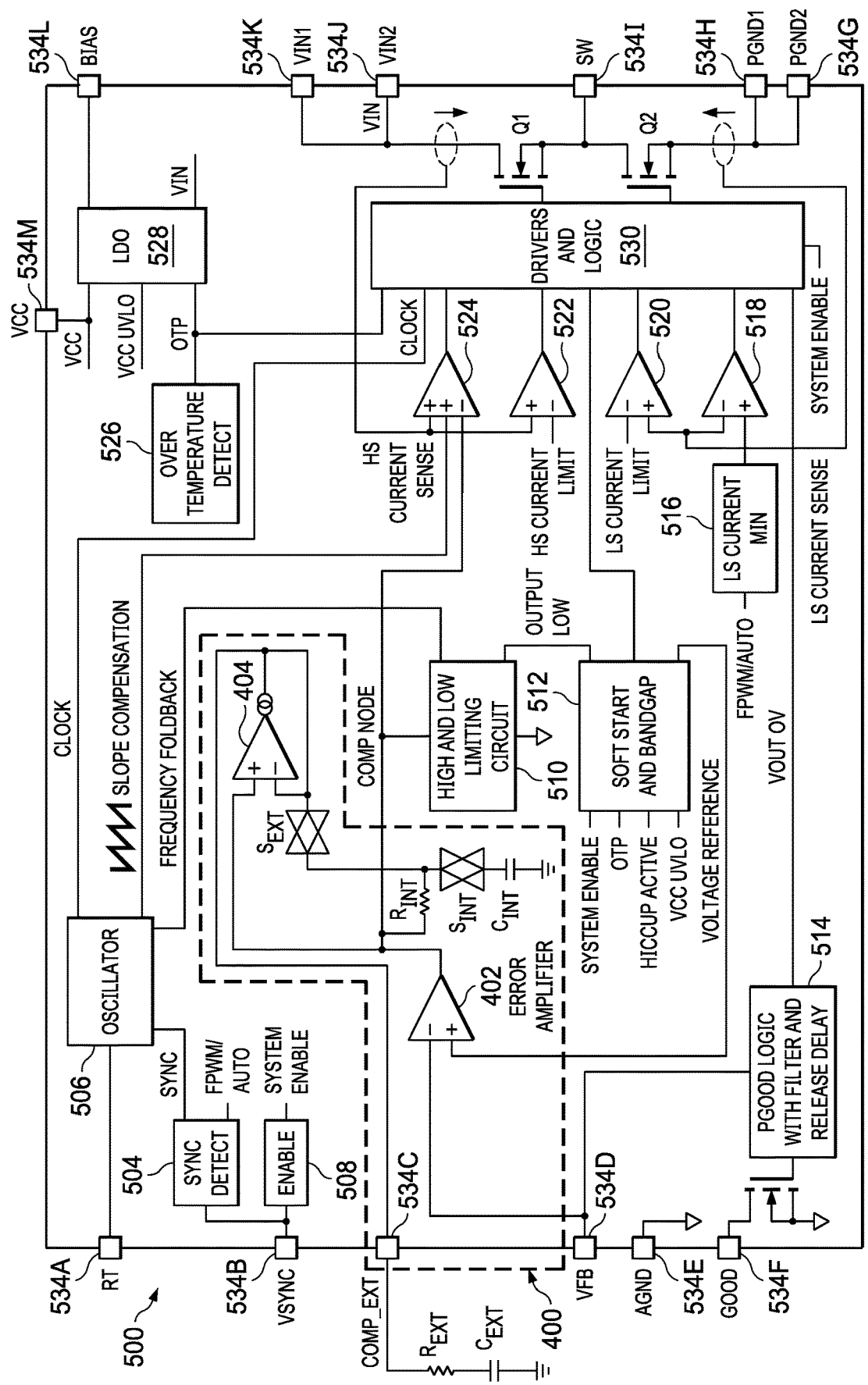
FIG. 5 is a diagram showing switching converter device in accordance with some examples.

FIG. 5 is a diagram showing a switching converter device 500 in accordance with some examples. The switching converter device 500 is an example of integrated circuit (IC) and/or packaged IC, where the switching converter device 500 includes the error amplifier circuit 400 described in FIG. 4 with an external compensation network ($R_{EXT}$ and $C_{EXT}$) option coupled to an external compensation pad 534C (an example of the external compensation pad 406 in FIG. 4). The switching converter device 500 also includes various other components included an oscillator 506, a sync detect circuit 504, an enable circuit 508, pgood logic 514 configured to provide a power good indicator. The switching converter device 500 also includes a high and low limiting circuit 510, a soft start and bandgap circuit 512, low-side current sense and limiting components (e.g., components 516, 518, and 520), high-side current sense and limiting components (e.g., components 522 and 524), drivers and logic 530, a high-side switch (Q1), a low-side switch (Q2), an overtemperature detect circuit 526, a low dropout (LDO) circuit 528. The switching converter device 500 also includes various pads 534A-534N for input/output signals. In the example of FIG. 5, the pads 534A-534N include an RT pad 534A, a VSYNC pad 534B, an external compensation (COMP_EXT) pad 534C, a feedback voltage (VFB) pad 534D, a ground pad 534E, a GOOD pad 534F, ground pads 534G and 534H, a switch node (SW) pad 534I, VIN pads 534J and 534K, a BIAS pad 534L, and a supply voltage (VCC) pad 534M. In other examples, Q1 and Q2 are external to the switching converter device 500. Also, in some examples, some of the components are omitted and/or other components are included with the switching converter device 500 to support different power stage topologies and/or control topologies.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ."

The term "couple" is used throughout the specification. The term may cover connections, communications, or signal paths that enable a functional relationship consistent with the description of the present disclosure. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

The above discussion is meant to be illustrative of the principles and various embodiments of the present invention. Numerous variations and modifications will become apparent to those skilled in the art once the above disclosure is fully appreciated.

What is claimed is:

1. A system comprising:
a switching converter having a switching converter input and a switching converter output, the switching converter configured to provide an output voltage at the switching converter output responsive to an input voltage at the switching converter input;
an error amplifier circuit including:
an error amplifier having a feedback signal input, a reference signal input and an error amplifier output, the feedback signal input coupled to the switching converter output;
a transconductance circuit having a transconductance input and a transconductance output, the transconductance input coupled to the error amplifier output;
a first switch coupled between a compensation circuit and the error amplifier output; and
a second switch coupled between the transconductance output and the compensation circuit; and
a control circuit having first and second control outputs coupled to the first and second switches, respectively.

2. The system of claim 1, wherein the compensation circuit is a first compensation circuit, the system further comprising a second compensation circuit, and wherein:
the second compensation circuit is coupled to the transconductance output; and
the control circuit is configured to open the first switch and close the second switch responsive to the second compensation circuit being coupled to the error amplifier circuit.

3. The system of claim 1, wherein the control circuit is configured to control the first and second switches.

4. The system of claim 2, wherein the second compensation circuit includes a capacitor and a resistor coupled to the transconductance output.

5. The system of claim 1, wherein the first switch has first and second switch terminals, and the compensation circuit includes:
a resistor having first and second resistor terminals, the first resistor terminal coupled to the error amplifier output, and the second resistor terminal coupled to the first switch terminal; and
a capacitor coupled to the second switch terminal.

6. The system of claim 5, wherein the resistor has a value of at least 0.9M ohms.

7. The system of claim 5, wherein the capacitor has a value of at least 25 pF.

8. The system of claim 1, wherein the transconductance circuit includes a transconductance amplifier having a higher transconductance than a transconductance of the error amplifier.

9. The system of claim 1, wherein the switching converter includes:
a comparator having an oscillator input, a comparator input and a comparator output, the comparator input coupled to the transconductance output;
a driver circuit coupled to the comparator output;
a high-side switch coupled to the driver circuit; and
a low-side switch coupled to the driver circuit.

10. A circuit comprising:
a first amplifier having a reference signal input, a feedback signal input, and a first amplifier output;
a compensation circuit having a compensation output and first and second compensation inputs, wherein the first compensation input is coupled to the first amplifier output, the second compensation input is coupled to a ground terminal, and the compensation circuit includes a resistor coupled to a capacitor;
a first switch coupled between the first amplifier output and the compensation circuit, and having a first control terminal;
a second amplifier having a second amplifier output and third and fourth amplifier inputs, wherein the third amplifier input is coupled to the first amplifier output; and
a second switch having a second control terminal and first and second switch terminals, wherein the first switch terminal is coupled to the compensation output, the second switch terminal coupled to the fourth amplifier input and to the second amplifier output.

11. The circuit of claim 10, wherein the compensation circuit is a first compensation circuit, the circuit further comprising:
a second compensation circuit coupled to the second amplifier output; and
a control circuit having first and second control outputs, wherein the first control output is coupled to the first control terminal, the second control output is coupled to the second control terminal, and the control circuit is configured to control the first and second switches responsive to the second compensation circuit.

12. The circuit of claim 10, wherein the second amplifier includes a transconductance amplifier.

13. The circuit of claim 10, wherein the second amplifier includes a transconductance circuit having a higher transconductance than a transconductance of the first amplifier.

14. The circuit of claim 10, further comprising a control circuit coupled to the first and second switches and configured to control the first and second switches.

15. A circuit comprising:
- an error amplifier having an error amplifier output, a feedback signal input and a reference signal input, wherein the feedback signal input is coupled to a converter voltage terminal;
- a transconductance amplifier having first and second transconductance inputs and a transconductance output, the first transconductance input coupled to the error amplifier output, the transconductance amplifier having a higher transconductance than a transconductance of the error amplifier;
- a compensation circuit having a compensation input and a compensation output, wherein the compensation input is coupled to the error amplifier output by a first switch;
- a second switch coupling the compensation output to the transconductance output; and
- a control circuit coupled to the first and second switches, the control circuit configured to control the first and second switches.

16. The circuit of claim 15, wherein the second switch includes first and second switch terminals, the first switch terminal coupled to the compensation circuit, and the second switch terminal coupled to the transconductance output and to the second transconductance input.

17. The circuit of claim 15, wherein the compensation circuit includes a resistor coupled between the error amplifier output and the second transconductance input.

18. The circuit of claim 17, wherein the compensation circuit includes a capacitor coupled to the resistor.

* * * * *